United States Patent
Kobayashi et al.

(10) Patent No.: US 11,621,163 B2
(45) Date of Patent: Apr. 4, 2023

(54) CRYSTALLIZATION OF TWO-DIMENSIONAL STRUCTURES COMPRISING MULTIPLE THIN FILMS

(71) Applicant: The Regents of the University of California, Oakland, CA (US)

(72) Inventors: Nobuhiko Kobayashi, Santa Cruz, CA (US); Wenchang Yeh, Santa Cruz, CA (US)

(73) Assignees: THE REGENTS OF THE UNIVERSITY OF CALIFORNIA, Oakland, CA (US); Shimane University

(*) Notice: Subject to any disclaimer, the term of this patent is extended or adjusted under 35 U.S.C. 154(b) by 299 days.

(21) Appl. No.: 16/989,231

(22) Filed: Aug. 10, 2020

(65) Prior Publication Data

US 2021/0043451 A1    Feb. 11, 2021

Related U.S. Application Data

(60) Provisional application No. 62/884,537, filed on Aug. 8, 2019.

(51) Int. Cl.
*H01L 21/02* (2006.01)
*C30B 29/16* (2006.01)
(Continued)

(52) U.S. Cl.
CPC ........ *H01L 21/02565* (2013.01); *C30B 13/06* (2013.01); *C30B 13/24* (2013.01); *C30B 19/08* (2013.01); *C30B 19/12* (2013.01); *C30B 29/16* (2013.01); *C30B 29/406* (2013.01); *C30B 29/42* (2013.01); *H01L 21/0243* (2013.01); *H01L 21/02389* (2013.01); *H01L 21/02395* (2013.01); *H01L 21/02631* (2013.01); *H01L 21/02683* (2013.01); *H01L 29/242* (2013.01); *H01L 21/02422* (2013.01)

(58) Field of Classification Search
None
See application file for complete search history.

(56) References Cited

U.S. PATENT DOCUMENTS 5,073,815 A * 12/1991 Kosaka ............. H01L 21/02488
257/E21.162
5,514,885 A *  5/1996 Myrick ............... H01L 21/0262
257/224

(Continued)

FOREIGN PATENT DOCUMENTS

JP       2000211988 A     8/2000

OTHER PUBLICATIONS

Hoppius, Jan S. et al., "Femtosecond Laser Crystallization of Amorphous Titanium Oxide Thin Films", Applied Physics Letters, Aug. 16, 2018 (published online), vol. 113, pp. 1-4.

(Continued)

*Primary Examiner* — Benjamin P Sandvik
(74) *Attorney, Agent, or Firm* — Carter, DeLuca & Farrell LLP

(57) ABSTRACT

A multi-layer thin film composite is formed by applying a thin film formed from non-single-crystalline oxide onto a substrate; applying a protection film onto the thin film; and supplying energy to the thin film through at least one of the protection film or the substrate.

19 Claims, 11 Drawing Sheets

(51) Int. Cl.
      *H01L 29/24*     (2006.01)
      *C30B 19/08*     (2006.01)
      *C30B 19/12*     (2006.01)
      *C30B 29/42*     (2006.01)
      *C30B 29/40*     (2006.01)
      *C30B 13/06*     (2006.01)
      *C30B 13/24*     (2006.01)

(56) References Cited

U.S. PATENT DOCUMENTS

| | | | |
|---|---|---|---|
| 5,932,003 A * | 8/1999 | Naomoto | C30B 13/22 |
| | | | 117/10 |
| 2006/0186412 A1 | 8/2006 | Jyumonji et al. | |
| 2010/0093182 A1 | 4/2010 | Jitsuno et al. | |
| 2011/0012222 A1 * | 1/2011 | Cho | H01L 31/0312 |
| | | | 257/E31.043 |
| 2014/0199858 A1 * | 7/2014 | Hoult | H01L 21/268 |
| | | | 438/795 |

OTHER PUBLICATIONS

Murali Dhanya S. et al., "Synthesis of Cu2O From CuO Thin Films: Optical and Electrical Properties", AIP Advances, Apr. 24, 2015 (published online), vol. 5, pp. 1-5.

International Search Report and Written Opinion dated Nov. 17, 2020 issued in corresponding PCT Appln. No. PCT/US2020/045604.

* cited by examiner

CRYSTALLIZATION OF TWO-DIMENSIONAL STRUCTURES COMPRISING MULTIPLE THIN FILMS

CROSS-REFERENCE TO RELATED APPLICATION

This application claims the benefit of and priority to U.S. Patent Provisional Application No. 62/884,537, filed on Aug. 8, 2019. The entire disclosure of the foregoing application is incorporated by reference herein.

BACKGROUND

Currently, a thin film of single-crystalline (SC) alloy material are obtained using costly SC substrates made of a material chemically and physically compatible to that of a SC thin film that is deposited on the SC substrate. Formation of SC thin films of alloy materials on a SC substrate is done through a rather expensive process such as epitaxy. As a result, the use of a thin film of SC alloy materials or respective multiple thin films is contingent upon the availability of an appropriate SC substrate thereby severely limiting its utilization. Thus, there is a need for alternative methods of forming one or more thin films of SC alloy materials on arbitrary substrates.

Crystallization of thin film materials by exploiting laser-induced crystallization has been advancing for the past four decades. This unique thin film technique has been predominantly used in processing thin film materials made of a single chemical element, with a significant emphasis on thin film materials comprised of a single chemical element like silicon (Si), used for the development of thin film transistors. However, harnessing this technique to extend its use for thin film materials containing multiple chemical elements (e.g., metal oxides) unlocks applications currently not accessible using conventional techniques. Thus, there is also a need for novel method of forming SC metal oxide selectively formed from metal oxide thin films.

SUMMARY

The present disclosure provides a composite having a two-dimensional (2D) structure that includes one or more thin films. The structure is formed from non-single-crystalline (NSC) alloy materials on a NSC substrate. Each of the NSC alloy materials has a specific chemical composition associated with, for instance, its cations and/or anions. A part of the 2D structure is crystallized—forming single-crystal (SC)—as the material undergoes melting at an elevated temperature and subsequent solidification upon cooling. The resulting 2D structure on the NSC substrate includes one or more thin films or multiple thin films made of SC alloy materials that have chemical compositions not significantly different from those of their original chemical compositions.

The present disclosure also provides a method by which a thin film of SC alloy materials (e.g., group III-V compound semiconductors) or respective multiple thin films is formed on a substrate from a non-single-crystalline (NSC) material, such as glass, or on a SC substrate highly-incompatible (e.g., silicon). Suitable SC alloy materials include a range of materials generally expressed by chemical formulas $A_xB_{1-x}$, $A_xB_{1-x}C$, $A_xB_{1-x}C_yD_{1-y}$, etc., where A, B, C, and D represent different chemical elements and x and y denote their respective chemical compositions. It is envisioned that the number of different chemical elements in an alloy material is unrestricted.

A SC alloy material may be represented by $AB_x$, where A is a chemical element that acts as a cation and B is a chemical element that acts as an anion that is more electronegative than A. In embodiments, the A element may be gallium (Ga) and the B element may be arsenic (As) or nitrogen (N). Suitable SC alloy materials include GaAs, GaN.

When the $AB_x$ alloy is initially formed with a specific chemical composition x, in particular, in the form of NSC thin film, the $AB_x$ alloy undergoes a phase transition (e.g., a transition from solid to liquid and vice versa). The B element often exhibits a strong tendency to evaporate and/or sublimate preferentially in comparison to the A element, resulting in a change in the chemical composition x of the $AB_x$ alloy upon such a phase transition. In some cases, a thin film made of the $AB_x$ alloy may turn into pure A upon the phase transition, which presents a problem if the goal is to form a SC layer of $AB_x$ from NSC layer of $AB_x$. The present disclosure provides a method for crystallization of NSC thin films formed from $AB_x$ alloy—by which a thin film of SC alloy materials (e.g., $AB_x$) or respective multiple thin films is formed on a NSC substrate or on a chemically-incompatible SC substrate with minimum change in chemical composition x in the $AB_x$ alloy as originally set for a NSC thin film. The disclosed methods overcome the problems of conventional methods, which require materials made of a single primary chemical element as NSC thin film and as such are not suitable for use with alloy materials that contain more than two primary chemical elements.

According to one embodiment of the present disclosure, a method for forming a composite is disclosed. The method includes applying a thin film formed from NSC alloy onto a substrate; applying a protection film onto the thin film; and supplying energy to the thin film through at least one of the protection film or the substrate.

According to one aspect of the above embodiment, the substrate is formed from a NSC alloy that is physically and chemically different from the NSC alloy of the thin film.

According to another aspect of the above embodiment, supplying energy includes focusing a laser beam. The laser beam may have such non-Gaussian beam profile as a line pattern having a length from about 1 micron (μm) to about 10 mm. The focused laser beam may be perpendicular to a plane defined by the thin film and parallel to a plurality of edge patterns defined through the thin film.

According to a further aspect of the above embodiment, the laser beam may have such non-Gaussian beam profile as a chevron pattern having two line portions with a distance between end points of the two line portions being from about 1 μm to about 10 mm.

According to yet another aspect of the above embodiment, the NSC alloy has a formula of $AB_x$, wherein A is gallium and B is selected from the group consisting of arsenic and nitrogen.

According to one aspect of the above embodiment, the method further includes forming a pattern on the substrate, wherein the pattern is at least one of a depression or a protrusion. The substrate has a first planar surface and the pattern has a second planar surface that is parallel to the first planar surface.

The present disclosure also provides for laser crystallization of metal fluorides, metal chlorides, and metal oxides. Suitable metals include iron, aluminum, titanium, gallium, indium, germanium, tin, lead, antimony, bismuth, vanadium, chromium, beryllium, manganese, cobalt, nickel, copper, zinc, zirconium, ruthenium, osmium, rhodium, and iridium. In embodiments, suitable metal oxides include oxides of any suitable metal, and include, but are not limited to, silver oxide ($Ag_2O$), aluminum oxide ($Al_2O$), cuprous oxide ($Cu_2O$), and the like.

A continuous-wave laser diode with a micrometer-scale chevron-shaped beam profile, namely, a micro-chevron laser beam (μ-CLB), is used to form single-crystal cuprous oxide ($Cu_2O$) strips crystallized in cupric oxide (CuO) thin films. Initially, the CuO thin films are deposited on fused silica substrates and may be covered with an optional amorphous carbon cap layer. Electron backscatter diffraction, Raman spectroscopy, photoluminescence spectroscopy, and UV-Vis spectroscopy were used to investigate the crystallinity and optical properties of the $Cu_2O$ strips revealing their unique characteristics associated with the crystallization process.

Laser crystallization is a useful technique for forming device structures with minimum thermal budgets because of its capability of heating and treating a thin film locally and selectively, minimizing thermal impacts on the substrate on which a thin film is deposited. Crystallization of a thin film driven by thermal energy provided via a heat source highly localized within the thin film offers a substantial advantage in particular when a substrate is made of materials with low glass-transition temperature or low melting temperature, such as polymers and covalent-network-glasses, minimizing undesirable physical and chemical interactions between the thin film and the substrate.

The method of SC crystallization according to the present disclosure may be used in laser crystallization of semiconductor thin films on arbitrary substrates and is of great value because conventional methods by which single-crystal thin films are obtained often employ epitaxial growth that requires expensive precursors, complex process control, and costly single-crystal substrates.

Previously, laser crystallization was applied to alloy semiconductor thin films containing multiple chemical elements (e.g., group IV compound semiconductors, group III-V compound semiconductors, metal oxide semiconductors); however, in all these cases, a femtosecond laser or excimer laser with a Gaussian beam profile was used, however, nominal lateral size of crystalline domains are on the order of 1 μm which is often much smaller than the minimum length required for integrating devices (e.g., transistors) on a chip resulting in undesirable nonuniformity over the chip. Using these laser types poses considerable challenges in developing laser crystallization processes that are economically sound and provide crystalline domains large enough for fabricating practical devices.

The present disclosure demonstrates laser crystallization of metal oxides, such as $Cu_2O$ strips, using continuous-wave (CW) laser diode (LD) with a micrometer-scale chevron-shaped beam profile-micro chevron laser beam (μ-CLB). The crystallization was induced in thin films made of non-single-crystal CuO (cupric oxide) capped with an amorphous carbon (a-C) cap layer, resulting in the formation of a single-crystal $Cu_2O$ (cuprous oxide) strip with a semi-infinite length. These crystallized strips exhibited peculiar optical properties reflecting the unique characteristics of the μ-CLB crystallization process.

According to one embodiment of the present disclosure, a method for forming a composite is disclosed. The method includes applying a thin film formed from a NSC oxide onto a substrate; applying a protection film onto the thin film; and supplying energy to the thin film through at least one of the protection film or the substrate to form a SC oxide.

According to one aspect of the above embodiment, the NSC oxide is cupric oxide. The SC oxide is cuprous oxide.

According to another aspect of the above embodiment, supplying energy includes focusing a laser beam having a micron chevron pattern. The laser may have a wavelength from about 400 nm to about 450 nm. The NSC oxide has a thickness selected to absorb energy of the laser beam at the wavelength. The thickness may be from about 120 nm to about 140 nm.

According to a further aspect of the above embodiment, the protection film is formed from an amorphous carbon. The protection film has a thickness from about 5 nm to about 20 nm.

According to yet another aspect of the above embodiment, a semiconductor device is formed using the method of the above embodiment.

BRIEF DESCRIPTION OF DRAWINGS

Various embodiments of the present disclosure will be described herein below with reference to the figures, in which like reference numerals designate identical or corresponding elements in each of the several views, wherein.

DETAILED DESCRIPTION

Figure 1:
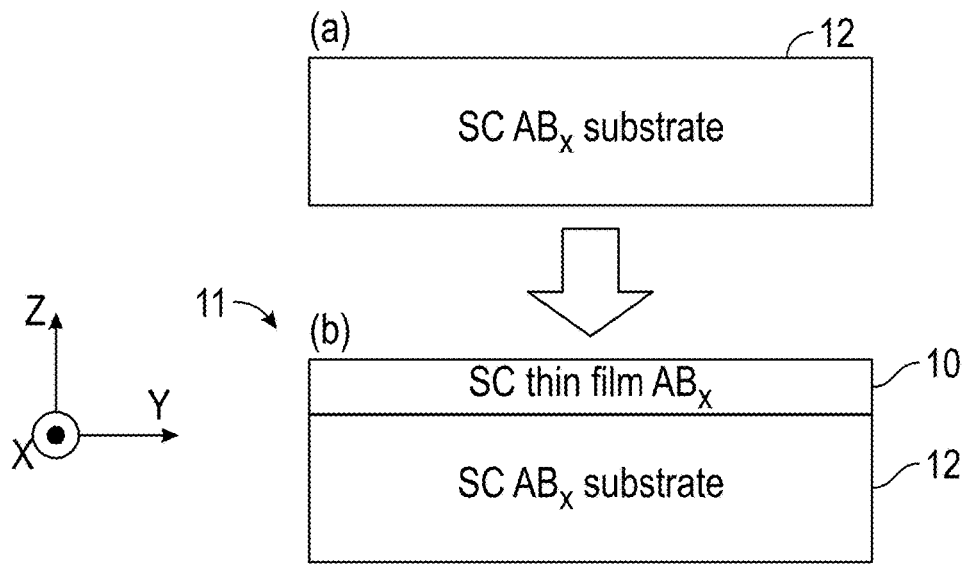
FIG. 1 is a schematic cross-sectional view of a substrate at multiple stages of a process for forming a SC thin film disposed thereon.

With reference to FIG. 1, an epitaxy method of forming a composite 11 having SC thin film 10 disposed on a SC substrate 12 alloy is shown. In FIGS. 1-12 shows a three dimensional coordinate marker XYZ to show the perspective of the substrate. The SC thin film 10 is formed from an $AB_x$ alloy, which includes an A chemical element that acts as a cation and a B chemical element that acts as an anion that is more electronegative than A. In embodiments, A element may be gallium (Ga). In further embodiments, B element may be arsenic (As), nitrogen (N). Suitable SC alloy materials include GaAs, GaN.

The SC thin film 10 is formed on a SC substrate 12 that is compatible with the $AB_x$ alloy. The SC substrate 12 may also be formed from an $AB_x$ alloy. As shown in FIG. 1 at step (a), the SC substrate 12 is provided without a film and at step (b) the SC thin film 10 is formed on the SC substrate 12 by epitaxy.

The epitaxy process utilizes a SC substrate that is physically and chemically compatible with the thin film that grows on the substrate. As a result, the use of a thin film of SC alloy materials or respective multiple thin films is contingent upon the availability of an appropriate SC substrate, thereby severely limiting its utilization. Epitaxy may be used to form a SC GaN thin film on sapphire substrates because SC GaN substrates are not well commercialized, resulting in the formation of structural defects in SC GaN thin films associated with physical and chemical mismatches that exist between GaN and sapphire.

Figure 2:
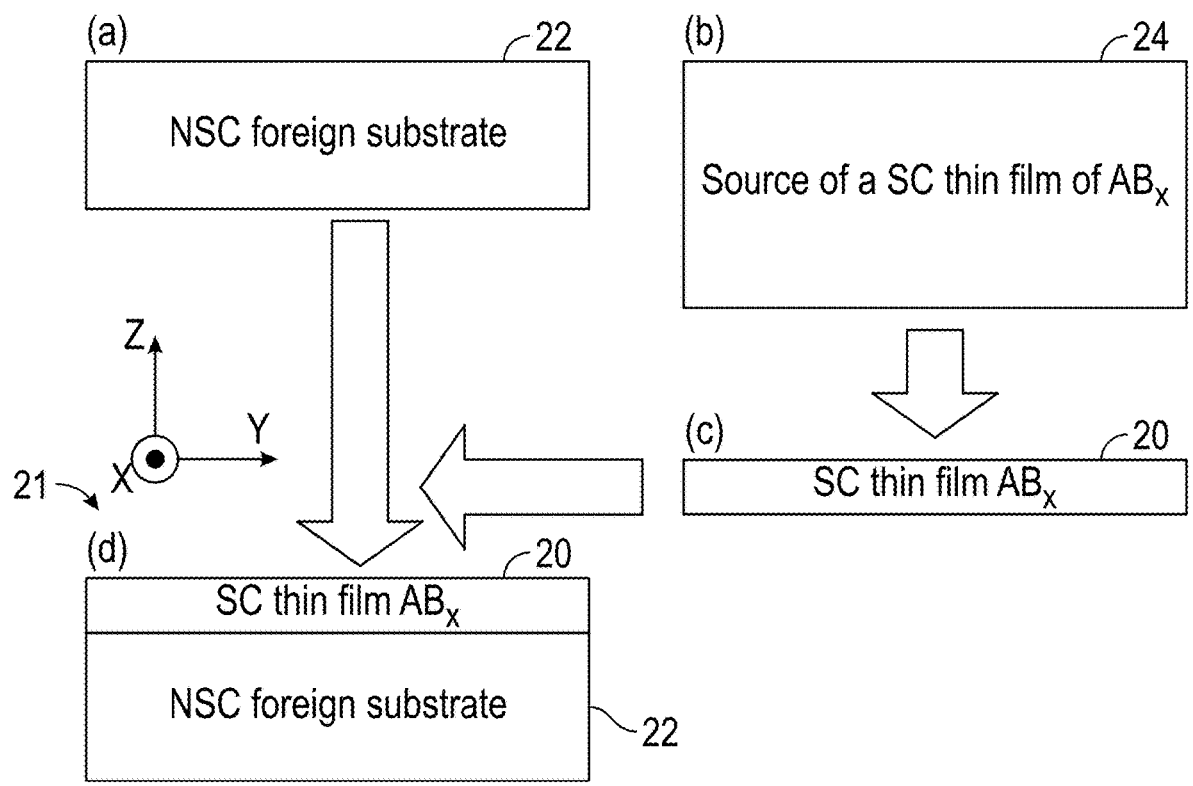
FIG. 2 is a schematic cross-sectional view of a substrate at multiple stages of another process for forming a SC thin film disposed thereon.

FIG. 2 shows another method for forming a composite 21 having a SC thin film 20 disposed on an NSC substrate 22 that is incompatible (e.g., foreign) with the $AB_x$ alloy of the SC thin film 20. The SC thin film 20 is substantially similar to the SC thin film 10. As used herein, the term "incompatible" and "foreign" denote a material that is physically and chemically different from the alloy of the thin film.

At step (a) a starting NSC substrate 22 is provided, at step (b) a source 24 of $AB_x$ alloy is provided, at step (c) the SC thin film 20 is formed from the source 24 of $AB_x$ alloy, and step (d) the SC thin film 20 is placed on the NSC substrate 22. While this method is a relatively simple process, it has a number of disadvantages. First, a source of $AB_x$ alloy needs to be prepared. This process is often difficult when seen from thermodynamic perspectives as the number of chemical elements (i.e., A, B, C, etc.) increases. Second, the SC thin film 20 needs to be extracted from the source 24, which becomes extremely challenging as the thickness of the SC thin 20 film decreases. Third, the SC thin film 20 needs to be extracted from the source. This process is not scalable since the SC thin film 20 having large area (e.g., about 12 inches in diameter) is difficult to obtain. Fourth, the process of attaching the SC thin film 20 to the NSC substrate 22 relies upon the presence of attractive interaction (e.g., van der Waals forces) between the SC thin film 20 and the NSC substrate 22. However, the attraction forces may not be strong enough to provide suitable adhesion and/or appropriate uniformity.

Figure 3:
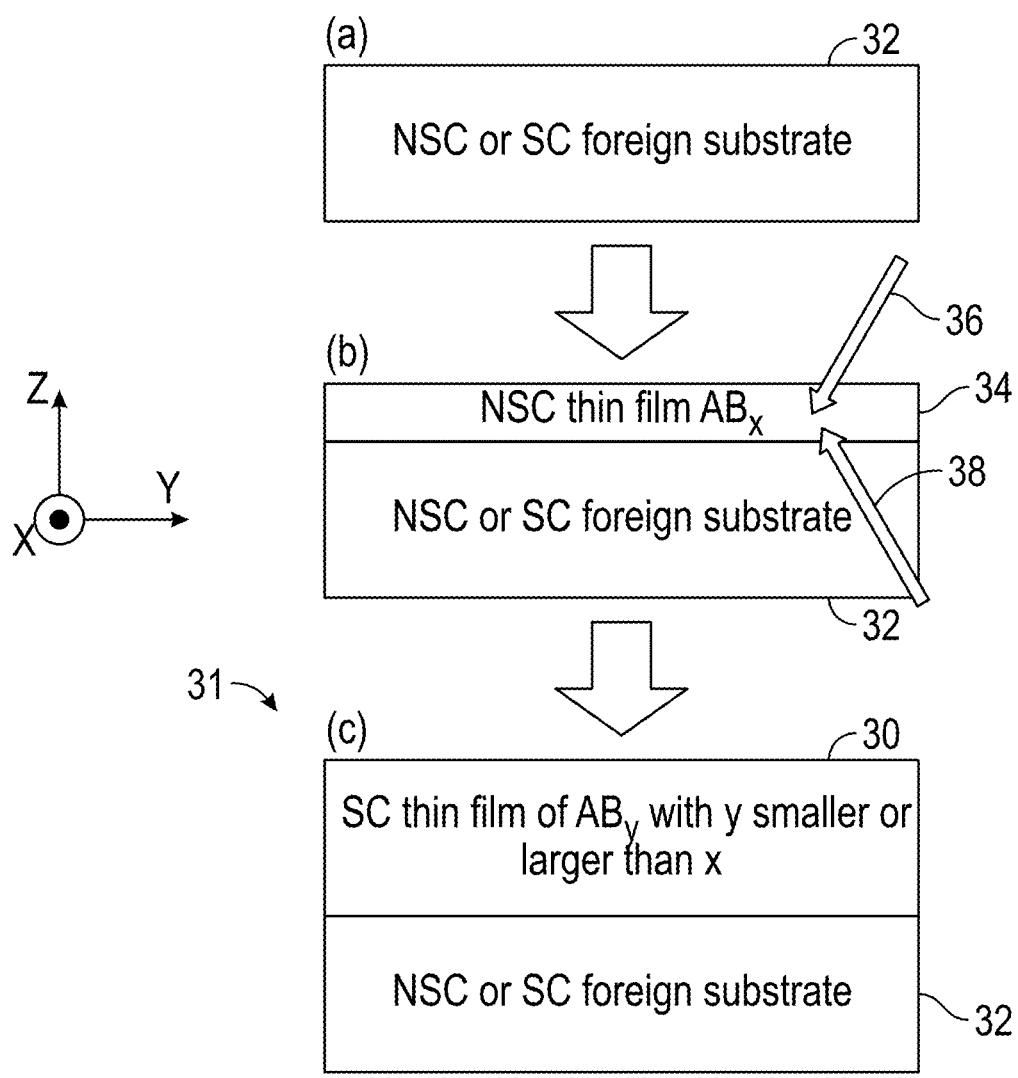
FIG. 3 is a schematic cross-sectional view of a substrate at multiple stages of yet another process for forming a SC thin film disposed thereon according to a further embodiment of the present disclosure.

FIG. 3 shows yet another method for forming a composite 31 having a SC thin film 30 disposed on an NSC substrate 32 that is incompatible (e.g., foreign) with the $AB_x$ alloy of the SC thin film 30. The SC thin film 30 is substantially similar to the SC thin film 10. At step (a) a starting NSC substrate 32 is provided, at step (b) an NSC thin film 34 of $AB_x$ alloy is formed on the NSC substrate 32, and at step (c) the NSC thin film 34 undergoes a phase transition upon being energized by various methods to form the SC thin film 30 with the $AB_y$ alloy. Energy (e.g., laser) may be provided in various ways to induce a phase transition in the NSC thin film 34. Energy may be provided externally (e.g., focusing a laser beam on the NSC thin film 34) to the NSC thin film 34 represented by an arrow 36 and/or by supplying energy through the NSC substrate 32 thereby energizing the NSC thin film 34 through the NSC substrate 32 as represented by an arrow 38. The NSC substrate 32 is transparent in order to allow for the laser beam to pass therethrough. As the laser is focused on the NSC thin film 34, a portion of its 2D structure is crystallized thereby forming the SC thin film 30 as the material undergoes melting at an elevated temperature and subsequent solidification upon cooling.

In embodiments, these two schemes of providing external energy may be performed separately or concomitantly. However, the method of FIG. 3 also has a number of disadvantages. If the constituent chemical elements A and B of the $AB_x$ alloy of the NSC thin film 34 have different vapor pressures, then specific chemical composition x of the $AB_x$ alloy of the NSC thin film 34 is not maintained during the phase transition resulting in formation of the SC thin film 30 with the $AB_y$ alloy rather than the $AB_x$ formulation of the NSC thin film 34. Thus, if the B element has vapor pressure higher than that of the A element, the $AB_x$ alloy of the NSC thin film 34 loses the B element resulting in a decrease in x, thus the NSC thin film 34 may become an SC or NSC thin film made almost entirely of the A element.

Figure 4:
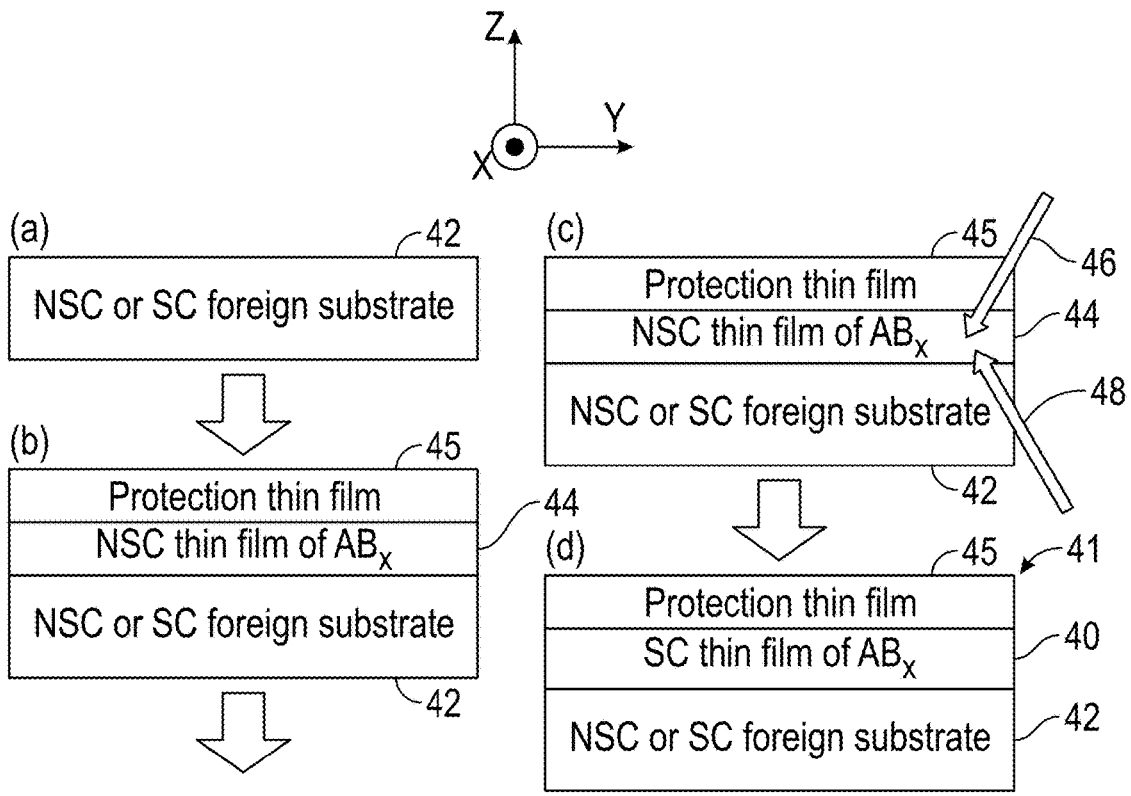
FIG. 4 is a schematic cross-sectional view of a substrate at multiple stages of a process for forming a SC thin film disposed thereon according to one embodiment of the present disclosure.

FIG. 4 shows a method according to the present disclosure for forming a composite 41 having a SC thin film 40 disposed on a substrate 42 that is incompatible (e.g., foreign) with the $AB_x$ alloy of the SC thin film 30 without a change in x of the $AB_x$ alloy. The SC thin film 40 is substantially similar to the SC thin film 10. The substrate 42 may be an SC or an NSC substrate.

At step (a) a starting substrate 42 is provided and at step (b) an NSC thin film 44 of $AB_x$ alloy is applied onto the substrate 42, followed by application of a protection thin film 45 over the NSC thin film 44. At step (c) the NSC thin film 44 is exposed to energy to undergo a phase transition upon being energized by various methods as described above with respect to FIG. 3. External energy may be provided to the NSC thin film 44 through the protection thin film 45 as represented by an arrow 46. Energy may also be provided to the NSC thin film 44 through the substrate 42 as represented by an arrow 48. The substrate 42 and the protection thin film 45 are transparent to the external energy (e.g., focused laser) represented by the arrow 46. In embodiments, these two schemes of providing external energy may be performed separately or concomitantly. At step (d) the NSC thin film 44 becomes the SC thin film 40 while retaining the original chemical composition x of the $AB_x$ alloy, unlike during the method of FIG. 3. The protection thin film 45 can either remain or be removed for further processing steps.

Figure 5:
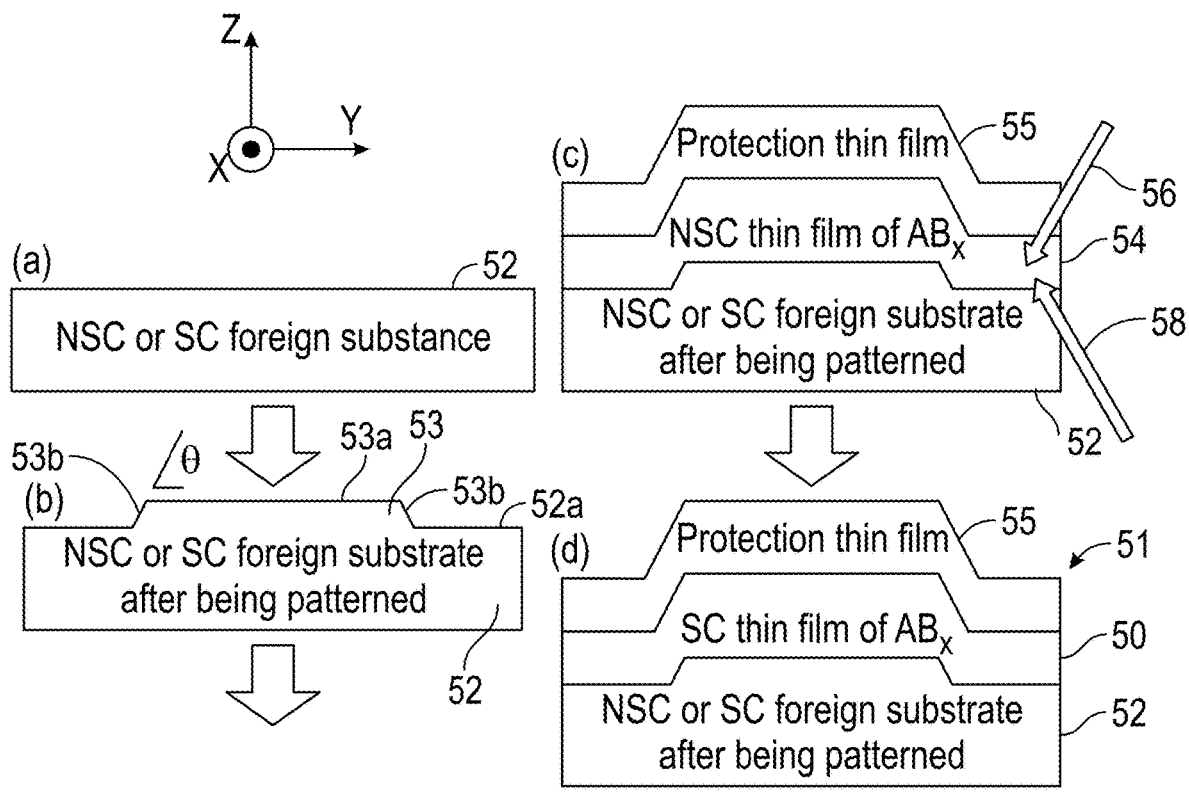
FIG. 5 is a schematic cross-sectional view of a substrate at multiple stages of a process for forming a SC thin film disposed thereon according to another embodiment of the present disclosure.

FIG. 5 shows a method, which is a variation of the method of FIG. 4, according to the present disclosure for forming a composite 51 having a SC thin film 50 disposed on a substrate 52 that is incompatible (e.g., foreign) with the $AB_x$ alloy of the SC thin film 60 without a change in x of the $AB_x$ alloy. The SC thin film 50 is substantially similar to the SC thin film 10. The substrate 52 may be an SC or an NSC substrate.

At step (a) a starting substrate 52 is provided, at step (b) the substrate 52 is patterned to form a non-planar surface (i.e., protruding mesa). As shown in FIG. 5, the substrate 52 may be patterned to form a pattern, such as a protrusion 53 having a planar surface 53a that is above and parallel relative to a planar surface 52a of the substrate 52. The planar surface 53a may have sloping edges 53b at angle θ defined by the edges 53b and the planar surface 52a. The angle θ may be any suitable angle and may be a negative angle, e.g., to form a depression 63 (FIG. 6) rather than the protrusion 53.

After the substrate 52 is patterned, an NSC thin film 54 of $AB_x$ alloy is applied onto the substrate 52, followed by application of a protection thin film 55 over the NSC thin film 54. The NSC thin film 54 and the protection thin film 55 maintain the pattern of the protrusion 53.

Steps (c) and (d) of FIG. 5 are substantially similar to the steps of FIG. 4. At step (c) the NSC thin film 54 is exposed to energy to undergo a phase transition upon being energized by various methods as described above with respect to FIG. 3. External energy may be provided to the NSC thin film 54 through the protection thin film 55 as represented by an arrow 56. Energy may also be provided to the NSC thin film 54 through the substrate 52 as represented by an arrow 58. At step (d) the NSC thin film 54 becomes the SC thin film 50 while retaining the original chemical composition x of the $AB_x$ alloy. The protection thin film 55 can either remain or be removed for further processing steps.

Figure 6:
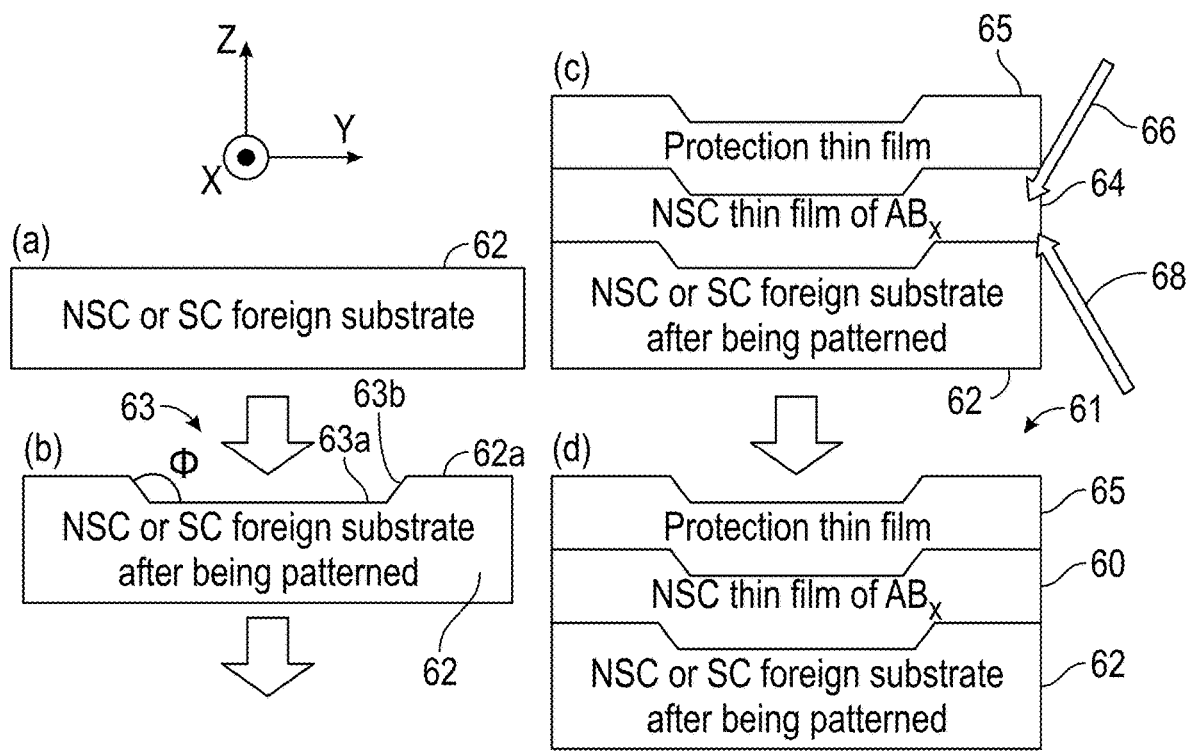
FIG. 6 is a schematic cross-sectional view of a substrate at multiple stages of a process for forming a SC thin film disposed thereon according to a further embodiment of the present disclosure.

FIG. 6 shows a method, which is a variation of the method of FIG. 5, according to the present disclosure for forming a composite 61 having a SC thin film 60 disposed on a substrate 62 that is incompatible (e.g., foreign) with the $AB_x$ alloy of the SC thin film 60 without a change in x of the $AB_x$ alloy. The SC thin film 60 is substantially similar to the SC thin film 10. The substrate 62 may be an SC or an NSC substrate.

At step (a) a starting substrate 62 is provided, at step (b) the substrate 62 is patterned to form a non-planar surface (i.e., depressing mesa). Such patterns—protruding mesas in FIG. 5(b) and depressing mesas in FIG. 6(b)—may coexist and both may be included on the substrate 62.

The substrate 62 may be patterned to form the depression 63 having a planar surface 63a that is below and parallel relative to a planar surface 62a of the substrate 62. The planar surface 63a may have sloping edges 63b at angle ϕ defined by the edges 63b and the planar surface 62a. The angle ϕ may be any suitable angle and may be a positive angle, e.g., to form the protrusion 53 (FIG. 5) rather than the depression 63 (FIG. 6).

After the substrate 62 is patterned, an NSC thin film 64 of $AB_x$ alloy is applied onto the substrate 62, followed by application of a protection thin film 65 over the NSC thin film 64. The NSC thin film 64 and the protection thin film 65 maintain the pattern of the depression 63. Steps (c) and (d) of FIG. 6 are substantially similar to the steps of FIG. 4. At step (c) the NSC thin film 64 is exposed to energy to undergo a phase transition upon being energized by various methods as described above with respect to FIG. 3. External energy may be provided to the NSC thin film 64 through the protection thin film 65 as represented by an arrow 66. Energy may also be provided to the NSC thin film 64 through the substrate 62 as represented by an arrow 68. At step (d) the NSC thin film 64 becomes the SC thin film 60 while retaining the original chemical composition x of the $AB_x$ alloy. The protection thin film 65 can either remain or be removed for further processing steps.

Figure 7:
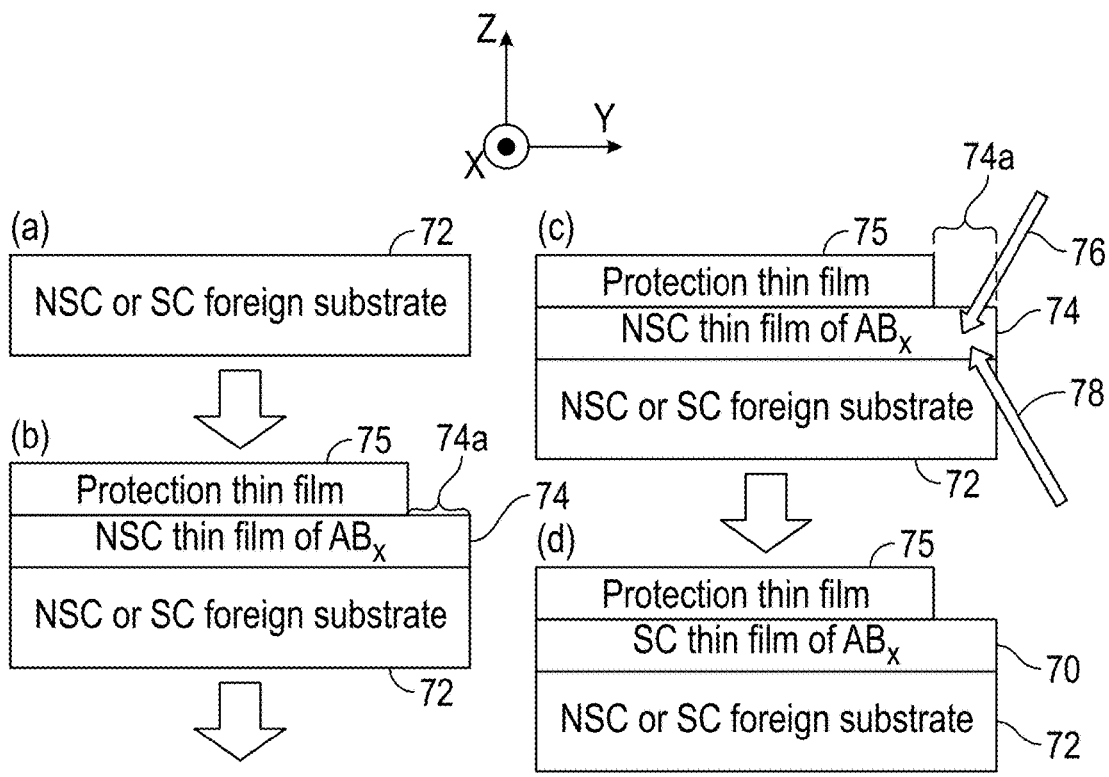
FIG. 7 is a schematic cross-sectional view of a substrate at multiple stages of a process for forming a SC thin film disposed thereon according to yet another embodiment of the present disclosure.

FIG. 7 shows a method according to the present disclosure for forming a composite 71 having a SC thin film 70 disposed on a substrate 72 that is incompatible (e.g., foreign) with the $AB_x$ alloy of the SC thin film 70 without a change in x of the $AB_x$ alloy. The SC thin film 70 is substantially similar to the SC thin film 10. The substrate 72 may be an SC or an NSC substrate.

At step (a) a starting substrate 72 is provided and at step (b) an NSC thin film 74 of $AB_x$ alloy is applied onto the substrate 72, followed by application of a protection thin film 75 over the NSC thin film 74. A portion of the NSC thin film 74 is removed to expose a portion 74a of the NSC thin film 74. At step (c) the NSC thin film 74 is exposed to energy to undergo a phase transition upon being energized by various methods as described above with respect to FIG. 3. External energy may be provided to the NSC thin film 74 through the protection thin film 75 as represented by an arrow 76 or directly through the exposed portion 74a. Energy may also be provided to the NSC thin film 74 through the substrate 72 represented by an arrow 78. The substrate 72 and the protection thin film 75 are transparent to the external energy being applied. In embodiments, these two schemes of providing external energy may be performed separately or concomitantly. At step (d) the NSC thin film 74 becomes the SC thin film 70 while retaining the original chemical composition x of the $AB_x$ alloy. The protection thin film 75 can either remain or be removed for further processing steps.

Figure 8:
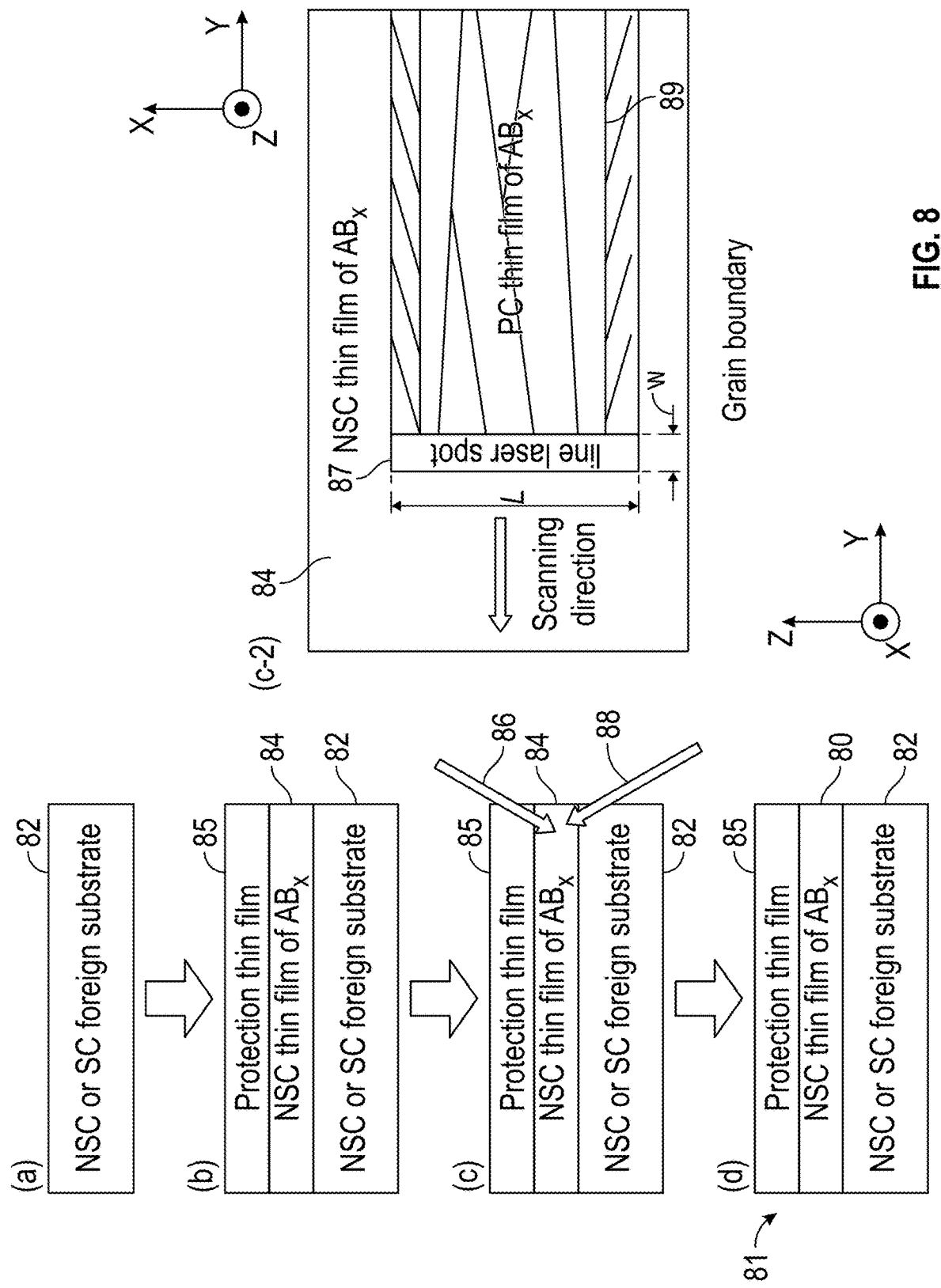
FIG. 8 is a schematic cross-sectional view of a substrate at multiple stages of a process for forming a SC thin film disposed thereon.

FIG. 8 shows a method for forming a composite 81 having a SC thin film 80 disposed on a substrate 82 that is incompatible (e.g., foreign) with the $AB_x$ alloy of the SC thin film 80. The SC thin film 80 is substantially similar to the SC thin film 10. The substrate 82 may be an SC or an NSC substrate.

At step (a) a starting substrate 82 is provided and at step (b) an NSC thin film 84 of $AB_x$ alloy is applied onto the substrate 82, followed by application of a protection thin film 85 over the NSC thin film 84. At step (c) the NSC thin film 84 is exposed to energy to undergo a phase transition upon being energized by various methods as described above with respect to FIG. 3. External energy may be provided to the NSC thin film 84 through the protection thin film 85 as represented by an arrow 86. Energy may also be provided to the NSC thin film 84 through the substrate 82 represented by an arrow 88. The substrate 82 and the protection thin film 85 are transparent to the external energy being applied. In embodiments, these two schemes of providing external energy may be performed separately or concomitantly.

External energy may be a continuous wave laser with a non-Gaussian beam profile (e.g., line shaped beam profile) scanning through the NSC thin film 84 to prompt continuous lateral crystal growth synchronized with laser scanning. The laser may have a line pattern 87 having a predetermined width w and length 1. As the line pattern 87 is scanned across the NSC thin film 84, the laser may be perpendicular to a plane defined by the NSC thin film 84. The length of the line pattern 87 may be from about 1 μm to about 10 mm. Laser scanning may result in formation of a polycrystalline (PC) thin film with longitudinal grains along scanning direction of the laser due to an inhomogeneous grain growth 89 at the solid-melt interface. At step (d) the NSC thin film 84 becomes the SC thin film 80. The protection thin film 85 can either remain or be removed for further processing steps.

Figure 9:
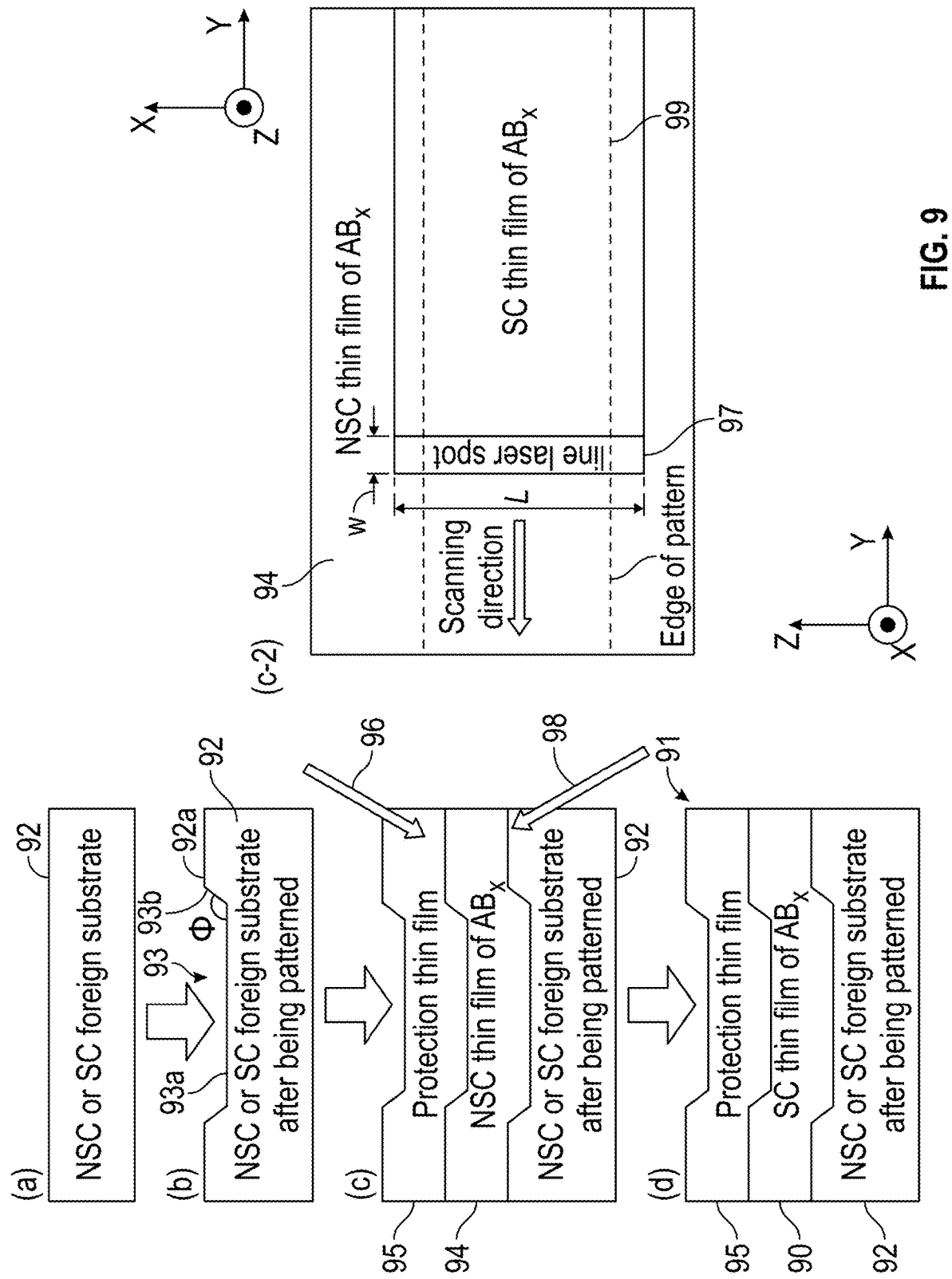
FIG. 9 is a schematic cross-sectional view of a substrate at multiple stages of a process for forming a SC thin film disposed thereon according to one embodiment of the present disclosure.

FIG. 9 shows a method for forming a composite 91 having a SC thin film 90 disposed on a substrate 92 that is incompatible (e.g., foreign) with the $AB_x$ alloy of the SC thin film 90. The SC thin film 90 is substantially similar to the SC thin film 10. The substrate 92 may be an SC or an NSC substrate.

At step (a) a starting substrate 92 is provided, at step (b) the substrate 92 is patterned to form a non-planar surface. The substrate 92 may be patterned to form the depression 93 having a planar surface 93a that is below and parallel relative to a planar surface 92a of the substrate 92. The planar surface 93a may have sloping edges 93b at angle φ defined by the edges 93b and the planar surface 92a. The angle φ may be any suitable angle and may be a positive angle, e.g., to form a protrusion 103 (FIG. 10) rather than the depression 93 (FIG. 9).

After the substrate 92 is patterned, an NSC thin film 94 of $AB_x$ alloy is applied onto the substrate 92, followed by application of a protection thin film 95 over the NSC thin film 94. The NSC thin film 94 and the protection thin film 95 maintain the pattern of the depression 93. Steps (c) and (d) of FIG. 9 are substantially similar to the steps of FIG. 4. At step (c) the NSC thin film 94 is exposed to energy to undergo a phase transition upon being energized by various methods as described above with respect to FIG. 3. External energy may be provided to the NSC thin film 94 through the protection thin film 95 as represented by an arrow 96. Energy may also be provided to the NSC thin film 94 through the substrate 92 represented by an arrow 98. The substrate 92 and the protection thin film 95 are transparent to the external energy being applied. In embodiments, these two schemes of providing external energy may be performed separately or concomitantly.

External energy may be a laser supplied by a continuous wave line-shaped laser scanning through the NSC thin film 94 to prompt continuous lateral crystal growth synchronized with laser scanning. The laser may have a line pattern 97 having a predetermined width w and length 1. The length of the line pattern 97 may be from about 1 μm to about 10 mm. As the line pattern 97 is scanned across the NSC thin film 94, the laser may be perpendicular to a plane defined by the NSC thin film 94 and in parallel with the edge of patterns 99 defined through the NSC thin film 94. At step (d) the NSC thin film 94 becomes a SC thin film 90 retaining the original chemical composition x of $AB_x$. The protection thin film 95 can either remain or be removed for further processing steps.

Figure 10:
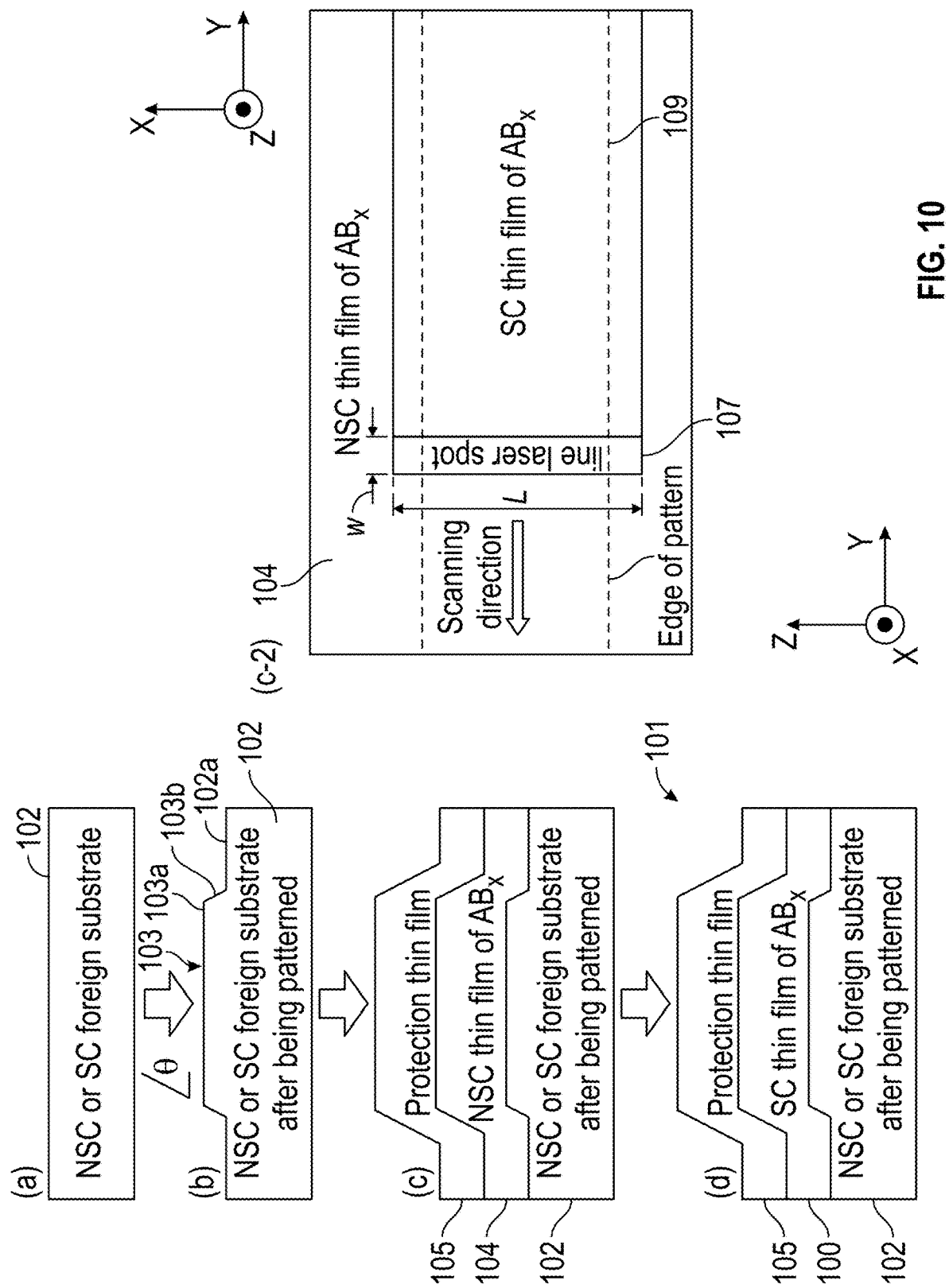
FIG. 10 is a schematic cross-sectional view of a substrate at multiple stages of a process for forming a SC thin film disposed thereon according to one embodiment of the present disclosure.

FIG. 10 shows a method for forming a composite 101 having a SC thin film 100 disposed on a substrate 102 that is incompatible (e.g., foreign) with the $AB_x$ alloy of the SC thin film 100. The SC thin film 100 is substantially similar to the SC thin film 100. The substrate 102 may be an SC or an NSC substrate.

At step (a) a starting substrate 102 is provided, at step (b) the substrate 102 is patterned to form a non-planar surface. The substrate 102 may be patterned to form a protrusion 103 having a planar surface 103a that is above and parallel relative to a planar surface 102a of the substrate 102. The planar surface 103a may have sloping edges 103b at angle θ defined by the edges 103b and the planar surface 102a. The angle θ may be any suitable angle and may be a negative angle, e.g., to form the depression 93 (FIG. 9) rather than the protrusion 103.

After the substrate 102 is patterned, an NSC thin film 104 of $AB_x$ alloy is applied onto the substrate 102, followed by application of a protection thin film 105 over the NSC thin film 104. The NSC thin film 104 and the protection thin film 105 maintain the pattern of the protrusion 103. Steps (c) and (d) of FIG. 10 are substantially similar to the steps of FIG. 4. At step (c) the NSC thin film 104 is exposed to energy to undergo a phase transition upon being energized by various methods as described above with respect to FIG. 3. External energy may be provided to the NSC thin film 104 through the protection thin film 105. Energy may also be provided to the NSC thin film 104 through the substrate 102. The substrate 102 and the protection thin film 105 are transparent to the external energy being applied. In embodiments, these two schemes of providing external energy may be performed separately or concomitantly.

External energy may be a continuous wave laser with a non-Gaussian beam profile (e.g., line shaped beam profile) scanning through the NSC thin film 104 to prompt continuous lateral crystal growth synchronized with laser scanning. The laser may have a line pattern 107 having a predetermined width and length. The length of the line pattern 107 may be from about 1 μm to about 10 mm. As the line pattern 107 is scanned across the NSC thin film 104, the laser may be perpendicular to a plane defined by the NSC thin film 104 and in parallel with the edge of patterns 109 defined through the NSC thin film 104. At step (d) the NSC thin film 104 becomes a SC thin film 110 retaining the original chemical composition x of $AB_x$. The protection thin film 105 can either remain or be removed for further processing steps.

Figure 11:
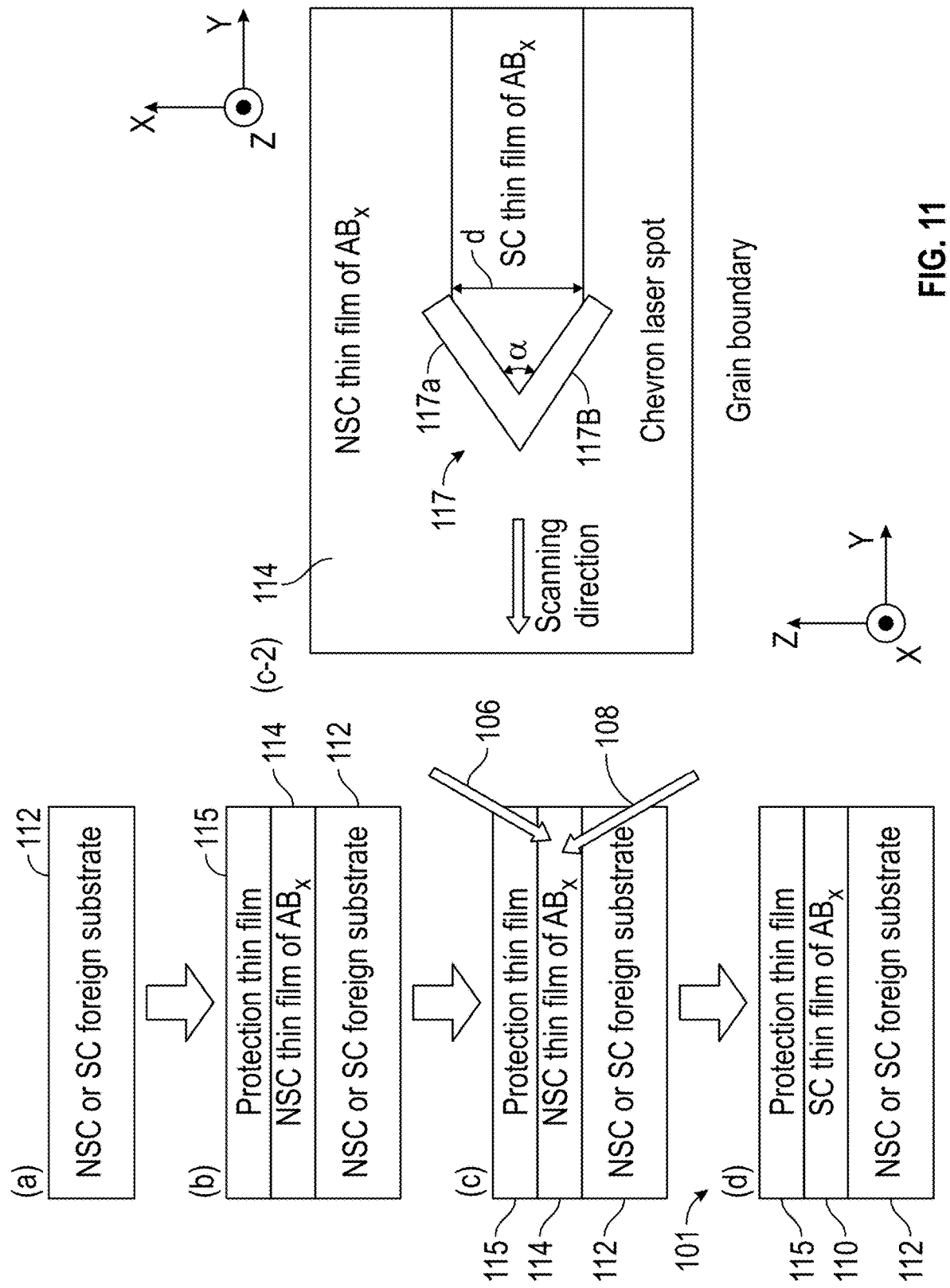
FIG. 11 is a schematic cross-sectional view of a substrate at multiple stages of a process for forming a SC thin film disposed thereon according to an embodiment of the present disclosure.

FIG. 11 shows a method for forming a composite 111 having a SC thin film 110 disposed on a substrate 112 that is incompatible (e.g., foreign) with the $AB_x$ alloy of the SC thin film 110. The SC thin film 110 is substantially similar to the SC thin film 110. The substrate 112 may be an SC or an NSC substrate.

At step (a) a starting substrate 112 is provided, at step (b) an NSC thin film 114 of $AB_x$ is applied onto the substrate 112, followed by application of a protection thin film 115 over the NSC thin film 114. Steps (c) and (d) of FIG. 11 are substantially similar to the steps of FIG. 4. At step (c) the NSC thin film 114 is exposed to energy to undergo a phase transition upon being energized by various methods as described above with respect to FIG. 3. External energy may be provided to the NSC thin film 114 through the protection thin film 115 as represented by an arrow 106. Energy may also be provided to the NSC thin film 114 through the substrate 112 represented by an arrow 108. The substrate 112 and the protection thin film 115 are transparent to the external energy being applied. In embodiment, these two schemes of providing external energy may be performed separately or concomitantly.

As shown in step (c-2), external energy may be a continuous wave laser with such a non-Gaussian beam profile as chevron-shaped beam profile scanning through the NSC thin film 114 to prompt continuous lateral crystal growth synchronized with laser scanning. A continuous-wave laser diode with a micrometer-scale chevron-shaped beam profile, namely, a micro-chevron laser beam (μ-CLB) may be used. The μ-CLB may generate a chevron pattern 117 having a predetermined sharp angle α between two line portions 117a and 117b. The angle α may be from about 30 to about 90°, and in embodiments may be about 45°. The angle α is selected to provide for better surface coverage. Distance d between end points of the line portions 117a and 117b may be from about 1 µm to about 10 mm.

The µ-CLB that provides laser light may be generated by having the output of a multimode laser beam pass through a one-sided dove prism that converts the laser beam into a chevron shape focused on the NSC thin film 114. The substrate 112 along with the NSC thin film 114 may be mounted on a linearly moving stage that advanced at a speed of about 1 mm/s with respect to the fixed position of the µ-CLB. A semi-infinite crystallized strip region formed with a width comparable to or less than the nominal spot size of the chevron pattern 117, while the length of the strip is only limited by the linear translational motion of the moving stage and may be extended as needed.

The µ-CLB that provides laser light may be generated by having the output of a multimode laser beam pass through a one-sided dove prism that converts the laser beam into a chevron shape focused on the NSC thin film 114. The substrate 112 along with the NSC thin film 114 may be mounted on a linearly moving stage that advanced at a speed of about 1 mm/s with respect to the fixed position of the µ-CLB. A semi-infinite crystallized strip region formed with a width comparable to or less than the nominal spot size of the chevron pattern 117, while the length of the strip is only limited by the linear translational motion of the moving stage and may be extended as needed.

As shown in step (c-2), the chevron pattern 117 is scanned across the NSC thin film 114, the laser may be perpendicular to a plane defined by the NSC thin film 114. This is shown by a strip of the SC thin film 115 left behind after the passage of the chevron pattern 117. The chevron pattern 117 may be oriented in any manner with the edge of patterns (not shown) defined through the NSC thin film 114. At step (d) the NSC thin film 114 becomes the SC thin film 110 retaining the original chemical composition x of $AB_x$. The protection thin film 115 can either remain or be removed for further processing steps.

The thin film composites according to the present disclosure may be used in a broad range of industries including microelectronics, optoelectronics, photonics, bioelectronics, and energy generation and storage industries that are currently limited to either high-cost SC thin films made of multiple primary chemical elements on a SC substrate or low performance NSC thin films made of multiple primary chemical elements on a NSC substrate.

Figure 12:
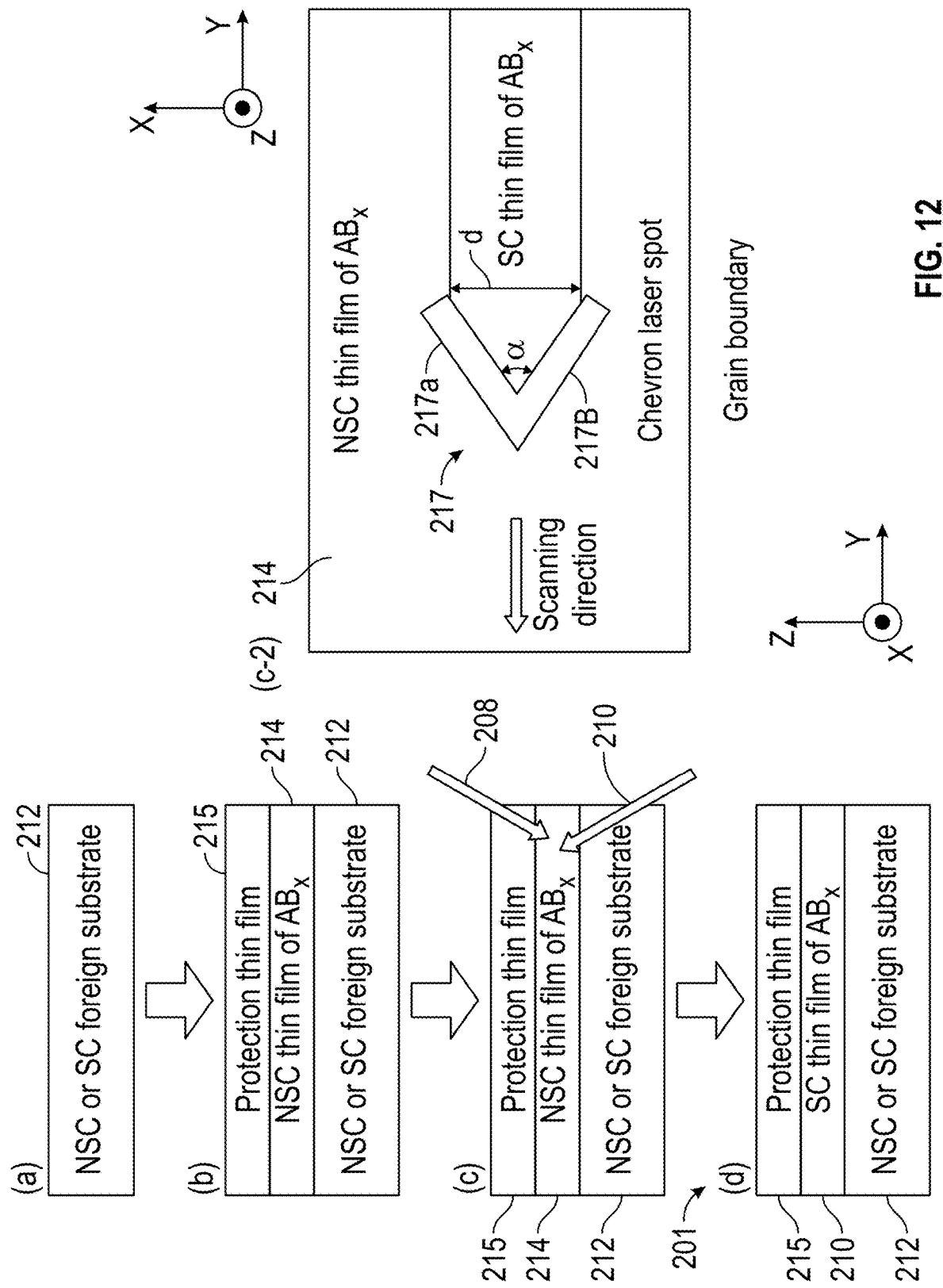
FIG. 12 is a schematic cross-sectional view of a substrate of NSC and cupric oxide (CuO) at multiple stages of a process for forming a SC thin film of cuprous oxide ($Cu_2O$) disposed thereon according to another embodiment of the present disclosure.

FIG. 12 shows a method for forming a composite 201 having a SC thin film 210 disposed on a substrate 212 that is incompatible (e.g., foreign) with the alloy of the SC thin film 210. The alloy of SC thin film 210 may be a SC metal oxide such as cuprous oxide ($Cu_2O$). The substrate 212 is made of a non-single-crystalline (NSC) material, such as glass or fused silica. The NSC thin film 214 and the crystallized SC strip 210 may have a length from about 0.1 mm to about 10 mm and a width from about 1 µm to about 5 µm.

At step (a) the starting substrate 212 is provided, at step (b) an NSC thin film 214 of precursor alloy is applied onto the substrate 212, followed by application of a protection thin film 215 over the NSC thin film 214. The precursor alloy of the NSC thin film 214 may be cupric oxide (CuO) and may have a thickness from about 100 nm to about 150 nm, and in embodiments may be about 130 nm. The protection thin film 215 may be formed from amorphous carbon (a-C) and may have a thickness from about 5 nm to about 20 nm, and in embodiments may be about 10 nm. The NSC thin film 214 and the protection thin film 215 may be deposited sequentially by radio frequency (RF) and direct current (DC) magnetron sputtering performed at a temperature from about 20° C. to about 30° C. in a vacuum (e.g., vacuum chamber).

Steps (c) and (d) of FIG. 12 are substantially similar to the steps of FIG. 11. At step (c) the NSC thin film 214 is exposed to energy to undergo a phase transition upon being energized by various methods as described above with respect to FIG. 3. External energy may be provided to the NSC thin film 214 through the protection thin film 215 as represented by an arrow 216. Energy may also be provided to the NSC thin film 214 through the substrate 212 represented by an arrow 218. The substrate 212 and the protection thin film 215 are transparent to the external energy being applied. In embodiment, these two schemes of providing external energy may be performed separately or concomitantly.

As shown in step (c-2), external energy may be a laser supplied by a continuous wave chevron-shaped laser scanning through the NSC thin film 214 to prompt continuous lateral crystal growth synchronized with laser scanning. A continuous-wave laser diode with a micrometer-scale chevron-shaped beam profile, namely, a micro-chevron laser beam (µ-CLB) may be used. The µ-CLB may have a wavelength from about 400 nm to about 450 nm, and in embodiments may be about 405 nm. The output power of the µ-CLB may be from about 70 mW to about 100 mW, and in embodiments may be about 80 mW. The The µ-CLB may generate a chevron pattern 217 having a predetermined angle α between two line portions 217a and 217b. The angle α may be from about 300 to about 90°, and in embodiments may be about 45°. Distance d between end points of the line portions 217a and 217b may be from about 1 µm to about 10 mm.

The µ-CLB that provides laser light may be generated by having the output of a multimode laser beam pass through a one-sided dove prism that converts the laser beam into a chevron shape focused on the NSC thin film 214. The substrate 212 along with the NSC thin film 214 may be mounted on a linearly moving stage that advanced at a speed of about 1 mm/s with respect to the fixed position of the µ-CLB. A semi-infinite crystallized strip region formed with a width comparable to or less than the nominal spot size of the chevron pattern 217, while the length of the strip is only limited by the linear translational motion of the moving stage and may be extended as needed.

As shown in step (c-2), the chevron pattern 217 is scanned across the NSC thin film 214, the laser may be perpendicular to a plane defined by the NSC thin film 214. This is shown by a strip of the SC thin film 215 left behind after the passage of the chevron pattern 217.

The thickness of the NSC thin film 214 is selected to obtain sufficient absorption from the µ-CLB at the selected wavelength. In embodiments, the thickness of the NSC thin film 214 may be about 130 nm to obtain sufficient absorption from the µ-CLB at the wavelength of about 405 nm. The chevron pattern 217 may be oriented in any manner with the edge of patterns (not shown) defined through the NSC thin film 214. At step (d) the NSC thin film 214 becomes a SC thin film 210 having a crystallized composition of $Cu_2O$ since the NSC thin film 214 is formed from CuO. The protection thin film 215 can either remain or be removed for further processing steps.

The following Examples illustrate embodiments of the present disclosure. These Examples are intended to be illustrative only and are not intended to limit the scope of the present disclosure. Also, parts and percentages are by weight unless otherwise indicated. As used herein, "room temperature" or "ambient temperature" refers to a temperature from about 20° C. to about 25° C.

EXAMPLES

Example 1

This example describes preparation of a substrate having a single-crystal $Cu_2O$ strip crystallized from a CuO thin film using a micro-chevron laser beam (μ-CLB).

A 130-nm-thick CuO thin film was deposited on fused silica substrates and subsequently capped with a 10-nm-thick a-C layer. The CuO thin film and a-C capping layer were deposited sequentially by radio frequency (RF) and direct current (DC) magnetron sputtering at room temperature, respectively, in a single vacuum chamber without breaking the vacuum. CuO and C sputtering targets with a purity of about 99.99% were used. A thickness of about 130 nm was chosen for the CuO thin film to obtain sufficient absorption of the μ-CLB at the wavelength of 405 nm. The real and imaginary parts of the CuO thin film refractive index were measured by spectroscopic ellipsometry and determined to be n=2.37 and k=1.01 at 405 nm, respectively. The 10-nm-thick a-C cap layer was found sufficient to reduce incongruent evaporation during the crystallization. The μ-CLB that provided laser light with a nominal spot size on the order of 10 μm and with a predetermined angle α of 45°. was generated by having the output of a 405 nm wavelength multimode CW LD pass through a one-sided dove prism that converted the original beam into a chevron shape focused on the thin film sample. The thin film sample was mounted on a linearly moving stage that advanced at a speed of about 1 mm/s with respect to the fixed position of the μ-CLB with the laser power output set to approximately 79 mW. A semi-infinite crystallized strip region was formed with a width comparable to or less than the nominal spot size 10 μm of the μ-CLB, while the length of the strip is only limited by the linear translational motion of the moving stage and can be extended as needed.

Example 2

This example describes analysis of the substrate of Example 1.

Figure 13:
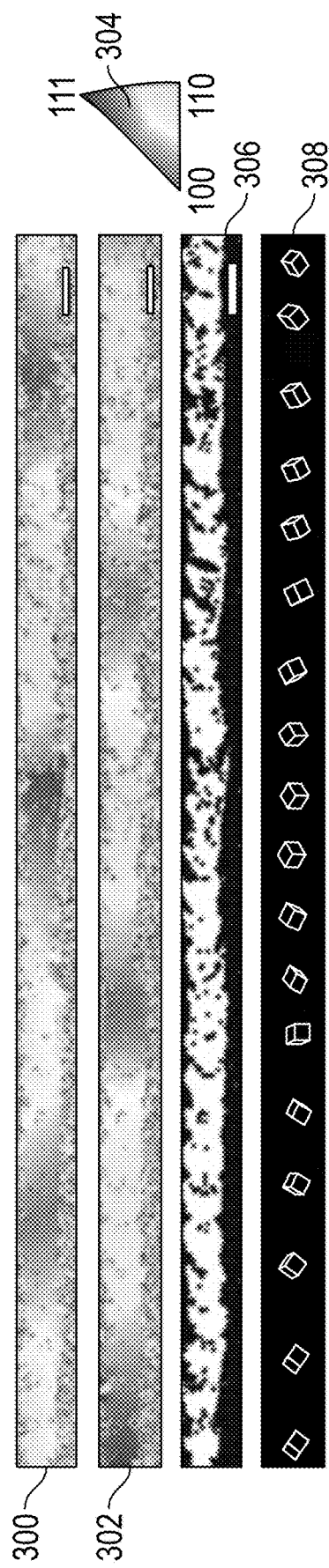
FIG. 13 shows electron backscatter diffraction (EBSD) crystal orientation maps in two directions, a corresponding color map (in grayscale), an EBSD boundary map, and a posture of cubic unit cells corresponding to a first EBSD orientation map according to an embodiment of the present disclosure.

Electron backscatter diffraction (EBSD) analysis was carried out on a crystallized strip in a scanning electron microscope (SEM) to determine its phase and crystallinity. The crystallized strip was identified as $Cu_2O$, also known as cuprite, a cubic crystal system with a lattice parameter of about 0.425 nm, belonging to the space group Pn$\bar{3}$m space group. With reference to FIG. 13, color EBSD crystallographic orientation map 300 in the normal direction (ND) and an orientation map 302 in the laser scanning direction (SD) of the crystallized $Cu_2O$ strip, referred to as single-crystal $Cu_2O$ strip (SC-$Cu_2O$ strip) hereafter, are shown in grayscale. Shown in FIG. 13 also is the inverse pole FIG. 304 illustrating a color map (shown in grayscale) corresponding to respective crystal orientations. FIG. 13 also shows a boundary map 306 of random angle grain boundaries (RGB, 5°-65°) and coincidence site lattice (CSL) boundaries, indicated by black and red lines, respectively. Only a few CSL boundaries are found in the SC-$Cu_2O$ strip. RGBs were found to exist at either side of the strip, and no RGBs completely crossed the strip, indicating the strip was a continuous single crystal along its length as well as across its width.

Diagram 308 illustrates the posture of the cubic unit cell seen from ND at corresponding positions in the orientation map 300, crystal orientation is rotating while the crystal advances in a negative pitch direction. Positive pitch rotation suggests that the density of $Cu_2O$ was higher in its solid phase than in its liquid phase, or that there was desorption of some component taking place at the surface during solidification.

Figure 14:
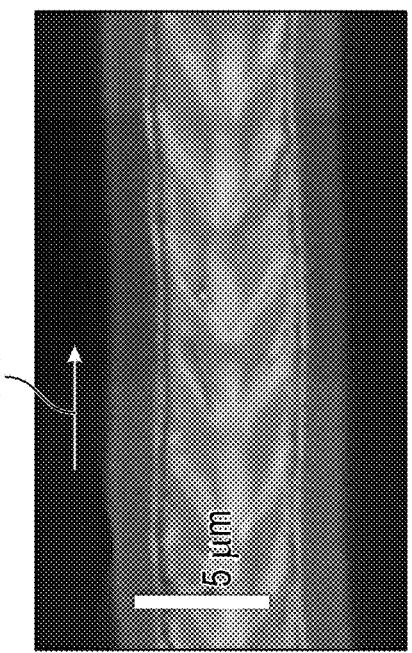
FIG. 14 is a scanning electron microscope image of the SC thin film of FIG. 12 according to an embodiment of the present disclosure.

FIG. 14 showed a top-view SEM image of the SC-$Cu_2O$ strip. RGBs existed periodically on the strip and are synchronized with crest regions of the wave like features. This is possibly due to the segregation of compounds other than $Cu_2O$ might be the reason. The orientation of domains seen in orientation maps 300 and 302 changes gradually and continuously along the strip.

The arrow 310 indicates the direction in which μ-CLB advanced with respect to the sample. The overall surface of the SC-$Cu_2O$ strip was textured with wave-like features, periodically found approximately 4 μm. This mushrooming of the solid material located along the center of the strip suggests agglomeration of $Cu_2O$ film takes place when melting occurs. The smooth region adjacent to the SC-$Cu_2O$ strip shows a region on the original CuO thin film not subjected to the laser crystallization and referred to as non-single-crystal CuO region (NSC-CuO region) henceforth.

The EBSD results indicated that the original CuO covered with an a-C cap layer was transformed into $Cu_2O$. The transformation was divided into the following two parts that occurred concurrently: the loss of oxygen in the reduction of CuO into $Cu_2O$ and the acquisition of oxygen by the a-C cap layer. The reduction of CuO took a straight path to the formation of copper without going through the formation of $Cu_2O$ when CuO was provided in the form of bulk. However, CuO present in a low-dimension structure (e.g., nanoparticles and thin films) were found to reduce to $Cu_2O$. Thus, where CuO is present in the form of thin film covered with an a-C cap layer, as in Example 1, the a-C cap layer provides an interface at which the reduction of CuO to $Cu_2O$ is promoted. Although $Cu_2O$ and CuO complete in a reduction environment; however, the reduction in CuO dominates. Furthermore, an a-C layer that covers the original CuO thin film is expected to exhibit physical properties that vary locally depending on how it was prepared. For instance, their density can vary within a wide range, resulting in anisotropy in their structural properties and substantially influencing their physicochemical properties in acquiring foreign oxygen. As the density decreased, a substantial increase in oxidation rate was observed at 800° C. In addition, as the temperature was raised, the oxidation rate of carbon was found to increase monotonically until a characteristic temperature was reached and remain nearly constant beyond the characteristic temperature, suggesting that the rate of oxidation of carbon at high temperatures depends on gaseous diffusion of oxygen through the surrounding atmosphere, in other words, the a-C cap layer regulated the amount of oxygen that needed to be released from the CuO thin film during the crystallization of $Cu_2O$ and presumably residual oxygen was released in the form of oxygen diatomic molecules and/or of volatile oxo carbon through the a-C cap layer.

Figure 15:
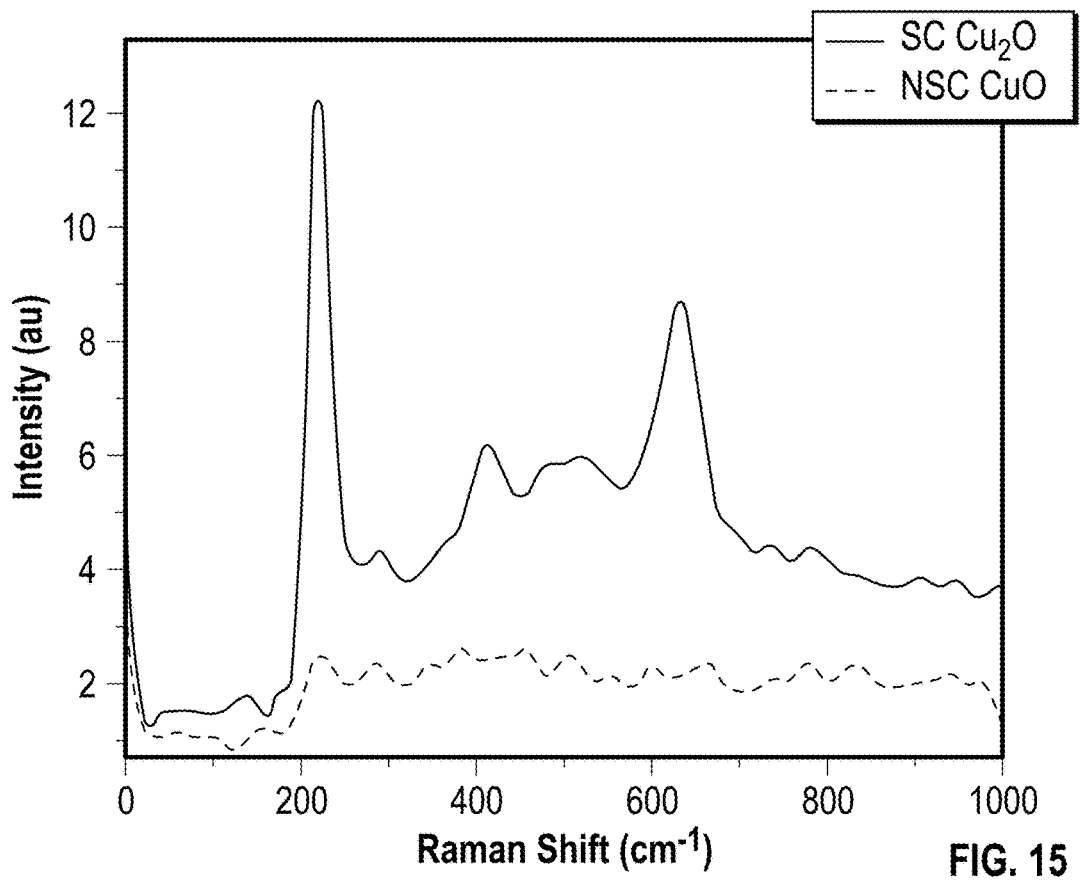
FIG. 15 are Raman spectra collected of the substrate of FIG. 12 from the NSC-CuO region and the SC thin film of $Cu_2O$ strip, which was vertically shifted for clarity according to an embodiment of the present disclosure.

Raman spectroscopy analysis was carried out with an excitation wavelength of about 514.5 nm to confirm the phase and assess the crystallinity of the SC-$Cu_2O$ strip. FIG. 15 shows Raman spectra collected from the SC-$Cu_2O$ strip (solid line) and the NSC-CuO region (dashed line). The spectrum from the SC-$Cu_2O$ strip showed several phonon modes unique to the crystalline phase of $Cu_2O$, while that from the NSC-CuO region showed no identifiable phonon modes. Characteristic modes (e.g., modes at about 300 $cm^{-1}$ and about 350 $cm^{-1}$) associated with CuO were not seen in the spectra of FIG. 15, confirming that the SC-$Cu_2O$ strip is predominantly made of $Cu_2O$. The two phonon modes at 218 $cm^{-1}$ and 436 $cm^{-1}$ represent second and fourth-order overtones, respectively, of the phonon mode at 109 $cm^{-1}$. An inactive Raman mode that is only infrared allowed in perfect $Cu_2O$ crystal, indicated that the SC-$Cu_2O$ strip bears structural integrity comparable to $Cu_2O$ formed under conditions near thermal equilibrium. The presence of the well-defined second-order overtone centered at 218 $cm^{-1}$ further indicates that the SC-$Cu_2O$ strip has high crystallographic integrity. The mode at 640 $cm^{-1}$ is most likely associated with an allowed LO phonon mode. Although complex oxidation kinetics of copper at room temperature resulting in the interplay between the two phases, CuO and $Cu_2O$, would contribute to the Raman analysis, the observed phonon modes may largely be attributed to Raman selection rules lifted due to point defects such as Cu vacancies commonly present in p-type $Cu_2O$.

Photoluminescence (PL) spectra of the NSC-CuO region and the SC-$Cu_2O$ strip were also collected with a Perkin Elmer luminescence spectrometer equipped with a xeon lamp. The excitation wavelength used for the PL analysis was 400 nm, and the PL spectra were collected in the spectral range from 1.25 to 2.625 eV at room temperature. For the PL measurement, a special coupon with 0.1 mm×2.0 mm area—strip region—was prepared by crystallizing multiple 10 μm×2 mm SC-$Cu_2O$ strips spatially separated by a fixed interval of 6 μm. Multiple strips were used to provide the volume overlap between the excitation light and the total volume of strips being excited, large enough to provide luminescence with sufficient intensity for the spectrometer to resolve. The excitation light source had a rectangular beam spot with an area comparable to the rectangular area filled with the SC-$Cu_2O$ strips.

Figure 16:
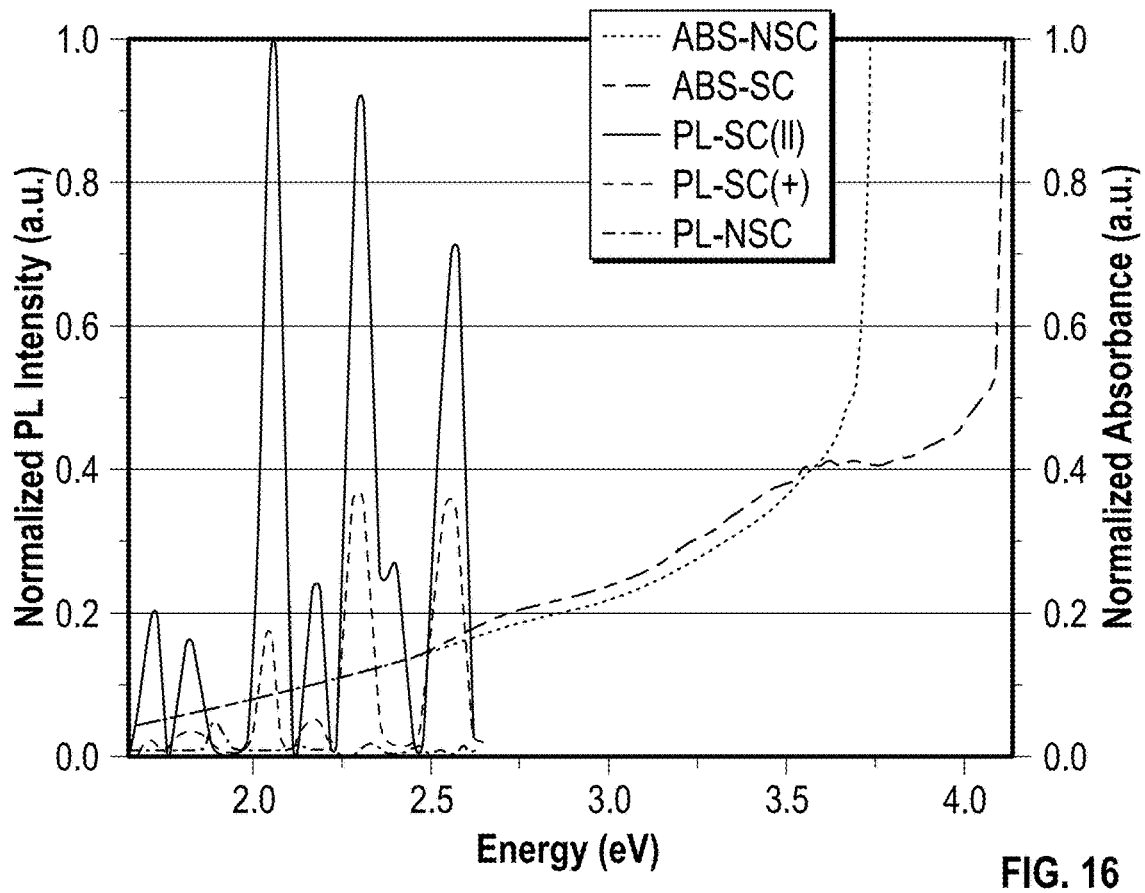
FIG. 16 are normalized photoluminescence and absorbance spectra of the NSC-CuO region and the SC-$Cu_2O$ strips of the substrate of FIG. 12 according to an embodiment of the present disclosure.

FIG. 16 shows three PL spectra; the spectrum PL-NSC (small dashed line) was collected from the NSC-CuO region. The two PL spectra, PL-SC (∥) in blue and PL-SC (+), were collected from the strip region by placing the rectangular excitation beam spot parallel (∥) and perpendicular (+), respectively, to the strips in the strip region. In other words, the only difference between the PL-SC (∥) and PL-SC (+) spectra was the areal size of the overlap between the rectangular excitation beam spot and the strip region. As expected, the PL-NSC spectrum confirms that no appreciable radiative recombination takes place in the NSC-CuO region while the two spectra, the PL-SC (∥) and PL-SC(+) spectra, exhibiting six distinctive peaks indicate that complex radiative recombination dynamics are present in the SC-$Cu_2O$ strip region. All PL peak intensities were higher for the PL-SC(∥) than those of the PL-SC(+) spectrum presumably because the net volume of crystallized $Cu_2O$ being optically excited in the PL measurement is much larger in the PL-SC(∥) spectrum than in the PL-SC(+) spectrum.

There were six narrow emission peaks, centered, respectively, about 1.37 eV, 1.62 eV, 2.05 eV, 2.17 eV, 2.29 eV, and 2.56 eV. The 2.17 eV emission is most likely to originate from the band edge recombination in SC-$Cu_2O$. The 2.17 eV emission, however, is weak because radiative recombination at the fundamental band edge is dipole forbidden. The 2.05 eV emission may be attributed to the first excitonic transition (n=1) associated with the yellow series of $Cu_2O$. The binding energy of the first or yellow excitonic series has been calculated to be approximately 150 meV, which is comparable to 160 meV—the difference in energy between the peak position of the band edge emission at 2.17 eV and the 2.05 eV emission seen in FIG. 16. This 2.05 eV emission, along with the emissions centered around 1.37 eV and 1.62 eV, may also be associated with an inter-band energy levels related to oxygen defects The origin of the 2.29 eV and 2.56 eV emissions may also be excitonic, possibly originating from the green and the blue excitonic series that have their highest energy transitions at 2.304 eV and 2.624 eV, respectively. The narrow linewidth of the emission peaks in the PL spectrum would suggest the involvement of radiative transitions between discrete and well-defined energy levels.

The special coupon prepared for collecting the PL spectra was also used to obtain optical absorbance spectra shown in FIG. 16. The absorbance spectra, ABS-NSC (dotted line) and ABS-SC (large dash lines), were collected from the NSC-CuO region and SC-$Cu_2O$ strip region, respectively, by measuring transmittance spectra using a Jasco v-670UV-Vis-NIR spectrophotometer in the energy range of 1.25 eV to 4.25 eV and subsequently converted to absorbance spectra. An appropriate shadow mask was used to discriminate the SC-$Cu_2O$ strip region and the NSC region that coexist on the coupon.

As seen in FIG. 16, the ABS-NSC spectrum shows a monotonic increase with energy until it unveils a sharp increase reaching its maximum, approximately at 3.7 eV. The ABS-SC spectrum shows an increasing trend similar to that of the ABS-NSC spectrum until it suddenly reaches its maximum, approximately 4.15 eV. There are three distinct features, in the ABS-SC spectrum, not seen in the ABS-NSC spectrum: a step-like feature at approximately 2.65 eV, another step-like feature at approximately 3.6 eV, and the energy at which the absorbance reaches its maximum is approximately 0.5 eV higher (i.e., a blue-shift) in comparison with that seen in the ABS-NSC spectrum. The 2.65 eV step may be ascribed to a transition in the blue exciton series and the step at 3.6 eV may be attributed to a high energy X1-X3 transition in the Brillouin zone, additionally a marked absorption edge with a peak or step-like feature about the associated band edge energy of 2.17 eV is not seen because of the forbidden band edge transitions $Cu_2O$ is known for. If the marked features seen in the PL-SC and the ABS-SC spectra collected from the SC-$Cu_2O$ strips are associated with carrier dynamics involving excitons, because all the measurements displayed in FIG. 16 were carried out at room temperature, they would need to originate from such environment as quantum-confined structures (e.g., quantum well) that strengthen the exciton binding energy. Since absorption spectra directly reflect the characteristics of the joint density of states in semiconducting materials, the presence of step-like features seen in the ABS-SC spectrum suggests the presence of quantum confined structures in the SC-$Cu_2O$ strips. Apart from the involvement of quantum confinement, the step-like features at approximately 2.65 eV and approximately 3.6 eV may suggest the involvement of inter-band transitions in the vicinity of the U-point often seen in high quality bulk $Cu_2O$, further indicating the presence of high crystallographic integrity of the SC-$Cu_2O$ strips.

Laser-induced crystallization has been implemented for semiconductor thin films for decades. However, its practical applications have been limited to only few successful demonstrations on thin films of single element semiconductors and related devices exclusively designed to accommodate the major limiting factor of the laser crystallization being the use of femtosecond and excimer lasers. This disclosure provides laser-induced crystallization of non-single-crystal CuO into single-crystal $Cu_2O$, a multi-element semiconductor, using CW LD with a μ-CLB. The $SC$-$Cu_2O$ strips had a length extending to several millimeters and width reaching 5 μm. The optical studies done on the $SC$-$Cu_2O$ strips at room temperature revealed complex and unusual emission and absorption characteristics most likely associated with excitonic transitions, suggesting the presence of quantum-confinement effects, this was not explicitly intended in our laser-induced crystallization process. The teachings of the present disclosure may be used to obtain single-crystal thin films of alloy semiconductors with quality and dimensions required for a range of devices not currently feasible.

It will be appreciated that of the above-disclosed and other features and functions, or alternatives thereof, may be desirably combined into many other different systems or applications. Various presently unforeseen or unanticipated alternatives, modifications, variations or improvements may be subsequently made by those skilled in the art which are also intended to be encompassed by the following claims. Unless specifically recited in a claim, steps or components of claims should not be implied or imported from the specification or any other claims as to any particular order, number, position, size, shape, angle, or material.

What is claimed is:

1. A method for forming a composite comprising:
    applying a thin film formed from a non-single-crystalline alloy onto a substrate; and
    supplying energy to the thin film through the substrate to form a single-crystalline alloy, wherein supplying energy includes focusing a laser beam in a chevron pattern.
2. The method according to claim 1, wherein the substrate includes a non-single-crystalline alloy that is physically and chemically different from the non-single-crystalline alloy of the thin film.
3. The method according to claim 1, wherein the laser beam has a line pattern having a length from about 1 micron (μm) to about 10 mm.
4. The method according to claim 1, wherein focusing the laser beam includes focusing the laser beam perpendicular to a plane defined by the thin film.
5. The method according to claim 4, wherein focusing the laser beam includes focusing the laser beam parallel to a plurality of edge patterns defined through the thin film.
6. The method according to claim 1, wherein the chevron pattern has two line portions with a distance between end points of the two line portions being from about 1 μm to about 10 mm.
7. The method according to claim 1, wherein the non-single-crystalline alloy has a formula of $AB_x$, wherein A is gallium and B is selected from the group consisting of arsenic and nitrogen.
8. The method according to claim 1, further comprising:
    forming a pattern on the substrate, wherein the pattern is at least one of a depression or a protrusion.
9. The method according to claim 8, wherein the substrate has a first planar surface and the pattern has a second planar surface that is parallel to the first planar surface.
10. The method according to claim 1,
    applying a protection film onto the thin film; and
    supplying energy to the thin film through at least one of the protection film or the substrate to form a single-crystalline alloy.
11. A method for forming a composite comprising:
    applying a thin film formed from a non-single-crystalline cupric oxide onto a substrate; and
    supplying energy to the thin film through the substrate to form a single-crystalline cuprous oxide.
12. A method for forming a composite comprising:
    applying a thin film formed from a non-single-crystalline oxide onto a substrate; and
    supplying energy to the thin film through the substrate to form a single-crystalline oxide, wherein supplying energy includes focusing a laser beam having a chevron pattern.
13. The method according to claim 12, wherein the laser beam has a wavelength from about 400 nm to about 450 nm.
14. The method according to claim 13, wherein the non-single-crystalline oxide has a thickness selected to absorb energy of the laser beam at the wavelength.
15. The method according to claim 14, wherein the thickness is from about 120 nm to about 140 nm.
16. The method according to claim 12, further comprising:
    applying a protection film onto the thin film; and
    supplying energy to the thin film through at least one of the protection film or the substrate to form a single-crystalline oxide.
17. The method according to claim 16, wherein the protection film is formed from an amorphous carbon.
18. The method according to claim 17, wherein the protection film has a thickness from about 5 nm to about 20 nm.
19. A semiconductor device formed using the method of claim 12.

* * * * *